(12) United States Patent
Omae et al.

(10) Patent No.: US 7,786,492 B2
(45) Date of Patent: Aug. 31, 2010

(54) LIGHT-EMITTING DEVICE

(75) Inventors: Mitsuhiro Omae, Tottori (JP); Jun Oki, Tottori (JP); Takafumi Watanabe, Tottori (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 211 days.

(21) Appl. No.: 12/184,285

(22) Filed: Aug. 1, 2008

(65) Prior Publication Data
US 2009/0039368 A1   Feb. 12, 2009

(30) Foreign Application Priority Data
Aug. 10, 2007   (JP) .............................. 2007-210138

(51) Int. Cl.
*H01L 33/00* (2010.01)
(52) U.S. Cl. .............................. 257/81; 257/98; 257/99; 257/E33.058; 257/E33.059; 257/E33.06; 257/E33.062
(58) Field of Classification Search .................. 257/81, 257/99, 98, E33.058, E33.059, E33.06, E33.062
See application file for complete search history.

(56) References Cited
U.S. PATENT DOCUMENTS
2005/0230691 A1 * 10/2005 Amiotti et al. ................ 257/79

FOREIGN PATENT DOCUMENTS
JP   2005-229003 A   8/2005

* cited by examiner

Primary Examiner—Long K Tran
(74) Attorney, Agent, or Firm—Marvin A. Motsenbocker; Mots Law, PLLC

(57) ABSTRACT

A light-emitting device offering satisfactory light emission characteristics combined with improved reliability has a substrate on the principal surface of which a non-polar electrode layer is formed, an LED chip mounted in a predetermined region on the non-polar electrode layer, a plurality of cathode and anode electrode layers formed on the principal surface of the substrate for supplying electric power to the LED chip, and a reflective frame formed of a metal material containing aluminum as its main content, the reflective frame having its inner circumferential surface formed into a reflective surface for reflecting the light from the LED chip. The reflective frame is fixed, directly, or indirectly with adhesive, to the non-polar electrode layer so as to surround the LED chip, with the inside of the reflective frame sealed with a light-transmitting member. An anodized aluminum coat with a thickness of 2 μm to 10 μm is formed by anodization at least on the inner circumferential surface, formed into the reflective surface, of the reflective frame.

7 Claims, 6 Drawing Sheets

FIG.1
FIG.2
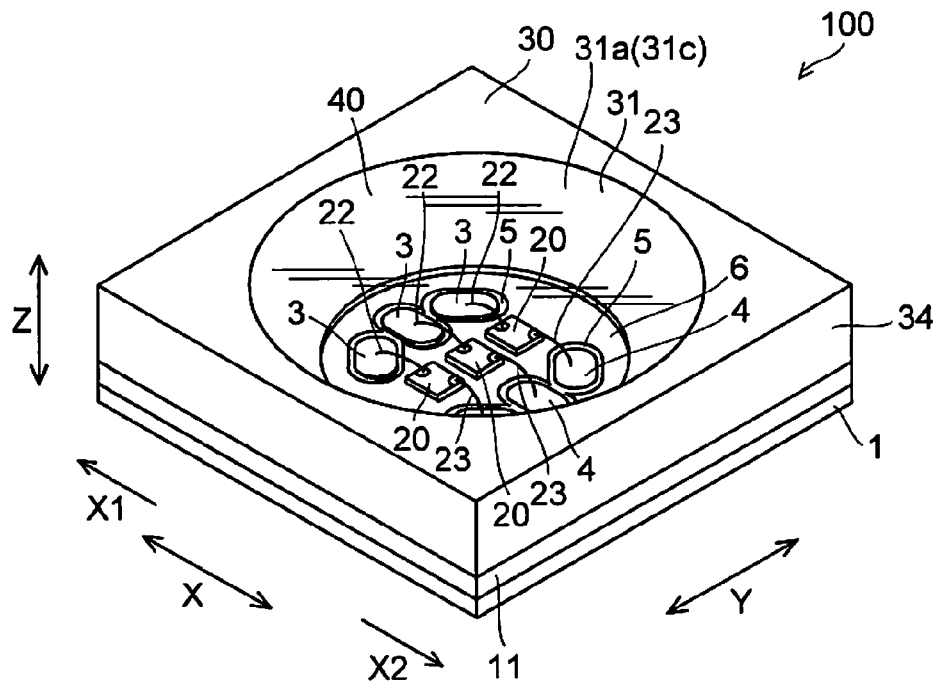
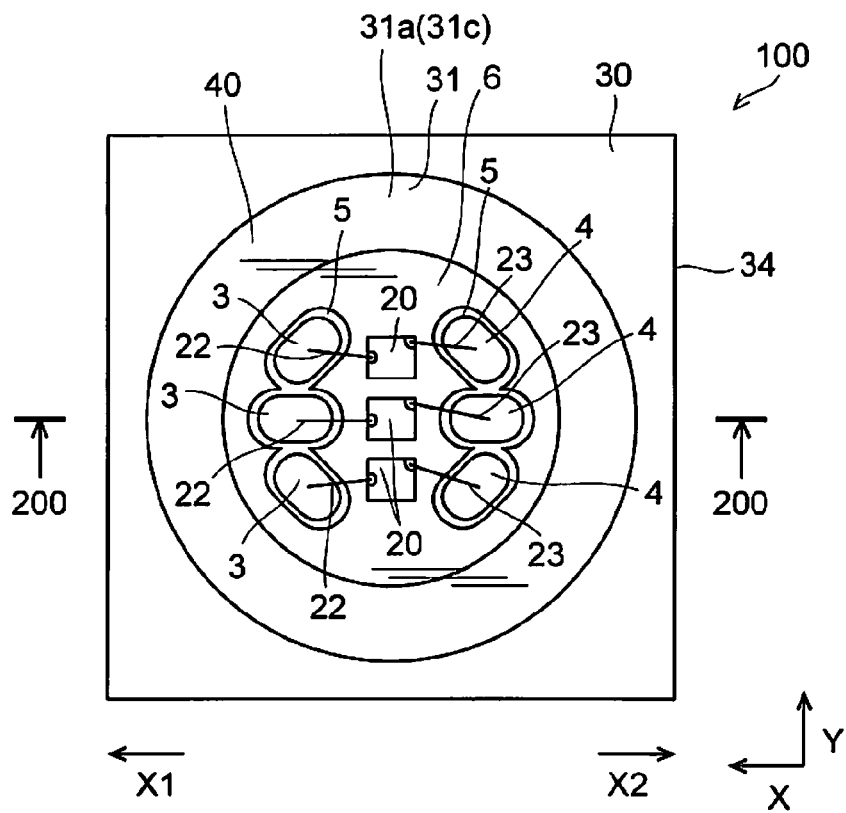

LIGHT-EMITTING DEVICE

This application is based on Japanese Patent Application No. 2007-210138 filed on Aug. 10, 2007, the contents of which are hereby incorporated by reference.

BACKGROUND OF THE INVENTION

1. Field of the Invention

The present invention relates to a light-emitting device, and more particularly to a light-emitting device provided with a reflective frame for reflecting the light from a light-emitting chip.

2. Description of Related Art

Conventionally there are known light-emitting devices provided with a reflective frame (reflector) for reflecting the light radiated from a light-emitting chip (see, for example, JP-A-2005-229003).

JP-A-2005-229003 mentioned above deals with a light-emitting device provided with a metal reflector formed of a metal material with high thermal conductivity. According to JP-A-2005-229003, in the just-mentioned metal reflector formed of a metal material with high thermal conductivity, there are formed a light-emitting chip mount cavity portion, which forms a reflective surface, and a leg portion. The leg portion is secured on a mount circuit board, and this allows the heat conducted to the metal reflector to be conducted via its leg portion to the mount circuit board efficiently.

According to JP-A-2005-229003, however, the reflector is bonded via an adhesive layer to a printed circuit board on which a light-emitting chip is mounted. Generally the adhesive used to bond the metal reflector and the printed circuit board together is an adhesive based on resin such as epoxy resin. Since an adhesive based on resin such as epoxy resin has low thermal conductivity, it does not efficiently conduct the heat accompanying the light emission of the light-emitting chip from the printed circuit board to the metal reflector. Thus, according to JP-A-2005-229003, certainly the heat conducted to the metal reflector can be conducted to the mount circuit board efficiently but, due to a rate-determining factor, namely the adhesive layer bonding the metal reflector and the printed circuit board together, it is disadvantageously difficult to conduct the heat accompanying the light emission of the light-emitting chip from the printed circuit board to the metal reflector efficiently.

Moreover, the metal material of which the metal reflector is formed is easily oxidized. For example, when the metal reflector is formed of a metal material containing aluminum as its main content, since aluminum is an extremely easily oxidized material, the metal reflector is easily oxidized by oxygen in air, forming an oxide film on the surface. This oxidation of the surface of the metal reflector occurs naturally, and thus the thickness, shape, etc. of the oxide film formed are not uniform but nonuniform. With a nonuniform oxide film formed on the surface of the light-emitting chip mount cavity portion of the metal reflector in this way, when the cavity portion is sealed with sealing resin, low adhesion between the metal reflector and the sealing rein results, producing a gap between them. This causes variation in the reflection efficiency of the light emitted from the light-emitting chip, disadvantageously leading to low reliability.

SUMMARY OF THE INVENTION

To solve the inconveniences mentioned above, it is an object of the present invention to provide a light-emitting device that offers satisfactory light emission characteristics combined with enhanced reliability.

To achieve the above object, according to one aspect of the present invention, a light-emitting device is provided with: a substrate on the principal surface of which a conductor layer is formed; a light-emitting chip mounted in a predetermined region on the conductor layer; a plurality of electrode layers formed on the principal surface of the substrate for supplying electric power to the light-emitting chip; and a reflective frame formed of a metal material containing aluminum as its main content, the reflective frame having its inner circumferential surface formed into a reflective surface for reflecting the light from the light-emitting chip. Here, the plurality of electrode layers include a cathode electrode layer and an anode electrode layer, and the conductor layer is electrically separated from at least one of the cathode electrode layer and the anode electrode layer. Moreover, the reflective frame is fixed, directly, or indirectly with adhesive, to the conductor layer so as to surround the light-emitting chip, with the inside of the reflective frame sealed with a light-transmitting member, and an anodized aluminum coat with a thickness of 2 μm to 10 μm is formed by anodization at least on the reflective surface of the reflective frame.

In the light-emitting device according to this aspect of the present invention, as described above, the reflective frame is fixed, directly, or indirectly with adhesive, to the conductor layer so as to surround the light-emitting chip. Thus the heat accompanying the light emission of the light-emitting chip can be conducted via the conductor layer to the reflective frame efficiently, and the heat so conducted can be rejected from the reflective frame efficiently. This helps suppress the degradation of light emission characteristics ascribable to a rise in the temperature of the light-emitting chip, and thus helps obtain satisfactory light emission characteristics. Moreover, an anodized aluminum coat with a thickness of 2 μm to 10 μm is formed by anodization at least on the reflective surface of the reflective frame, which is formed of a metal material containing aluminum as its main content. Thus the reflective surface can be made uniform. This helps improve the adhesion between the reflective frame and the light-transmitting member, helps reduce variation in the reflection efficiency of the light emitted from the light-emitting chip, and helps obtain enhanced reliability. Moreover, in the light-emitting device according to this aspect, the conductor layer is electrically separated from at least one of the cathode electrode layer and the anode electrode layer. Thus it is possible to fix the reflective frame to the substrate without giving consideration to electrical short-circuiting.

In the light-emitting device according to the above-described aspect of the present invention, the thickness of the anodized aluminum coat formed by anodization is 2 μm to 10 μm, preferably 2 μm to 5 μm. Thus the reflectance at which the light emitted from the light-emitting chip is reflected can be kept at a high level, and the anodized aluminum coat can be made uniform. This helps improve the adhesion between the reflective frame and the light-transmitting member, and thus helps reduce variation in the reflection efficiency of the light emitted from the light-emitting chip, and helps obtain enhanced reliability.

In the light-emitting device according to the above-described aspect of the present invention, preferably, the anodized aluminum coat is formed by anodization on the part of the reflective frame other than where it makes contact with the conductor layer. With this structure, it is possible to suppress the lowering of the thermal conductivity from the conductor layer to the reflective frame ascribable to the low thermal conductivity of an anodized aluminum coat as would result if it were formed on the part of the reflective frame where it makes contact with the conductor layer. It is thus possible to suppress the degradation of light emission characteristics ascribable to a rise in the temperature of the light-emitting chip, and thus helps obtain satisfactory light emission characteristics.

In the light-emitting device according to the above-described aspect of the present invention, preferably, a plated metal layer is formed by the plating of a metal on the part of the reflective frame where it makes contact with the conductor layer. With this structure, owing to the plated metal layer formed on the part of the reflective frame where it makes contact with the conductor layer, the heat accompanying the light emission of the light-emitting chip can be conducted via the conductor layer to the reflective frame efficiently, and the heat so conducted can be rejected from the reflective frame efficiently. This helps suppress the degradation of light emission characteristics ascribable to a rise in the temperature of the light-emitting chip, and thus helps obtain satisfactory light emission characteristics.

In the light-emitting device according to the above-described aspect of the present invention, preferably, the adhesive is an electrically conductive adhesive. With this structure, even in a case where the reflective frame is fixed to the conductor layer indirectly with adhesive, the heat accompanying the light emission of the light-emitting chip can be conducted via the conductor layer to the reflective frame efficiently, and the heat so conducted can be rejected from the reflective frame efficiently. This helps suppress the degradation of light emission characteristics ascribable to a rise in the temperature of the light-emitting chip, and thus helps obtain satisfactory light emission characteristics.

In the light-emitting device according to the above-described aspect of the present invention, preferably, a step portion is formed in a bottom portion of the reflective frame, and the step portion has a side wall portion for preventing the adhesive fixing the reflective frame to the conductor layer from flowing into the region inside the reflective frame. With this structure, it is possible to suppress the inconvenience of the adhesive being irradiated with the light from the light-emitting chip as a result of the adhesive flowing into the region inside the reflective frame. This helps suppress the deterioration- or alteration-induced discoloration of the adhesive resulting from its being irradiated with light, and thus helps suppress the inconvenience of degraded light emission characteristics and reliability resulting from the deterioration- or alteration-induced discoloration of the adhesive. Thus, even when the reflective frame is bonded to the conductor layer with adhesive, it is possible to obtain a light-emitting device offering satisfactory light emission characteristics.

In the light-emitting device according to the above-described aspect of the present invention, preferably, the light-emitting chip is a light-emitting diode chip.

In the light-emitting device according to the above-described aspect of the present invention, the conductor layer may be an electrically non-polar one, or may be one connected to ground (earth).

As described above, according to the present invention, it is possible to provide a light-emitting device that offers satisfactory light emission characteristics combined with enhanced reliability.

BRIEF DESCRIPTION OF THE DRAWINGS

FIG. 1 is an overall perspective view of a surface-mount LED embodying the present invention;

FIG. 2 is a plan view of the surface-mount LED of FIG. 1 as seen from above;

DETAILED DESCRIPTION OF PREFERRED EMBODIMENTS

Hereinafter, an embodiment of the present invention will be described in detail with reference to the accompanying drawings. The embodiment deals with a case in which the present invention is applied to a surface-mount LED as one example of a light-emitting device.

Figure 3:
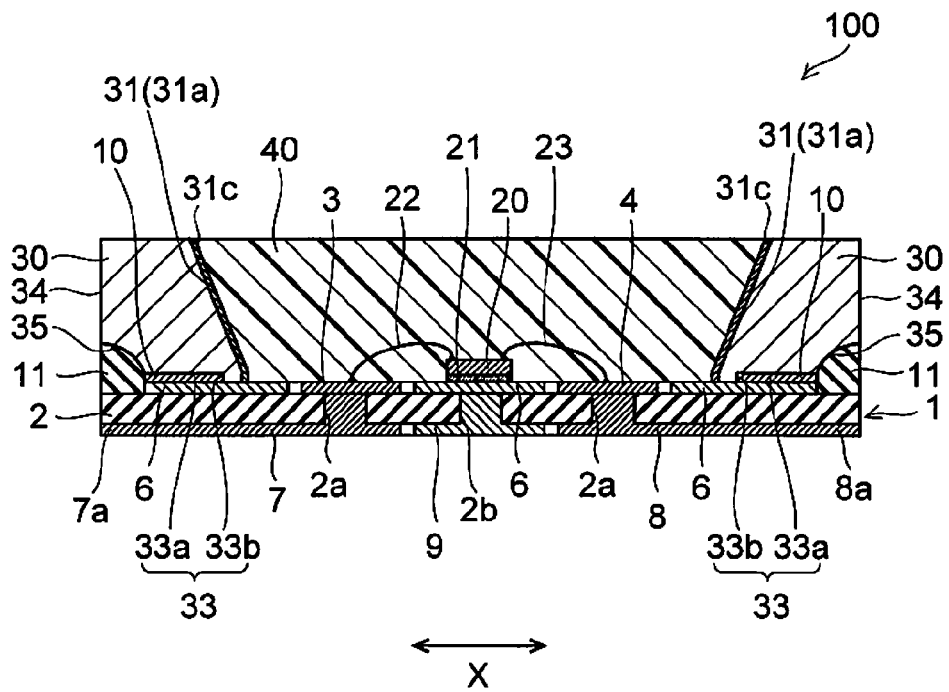
FIG. 3 is a sectional view taken along line 200-200 in FIG. 2.

FIG. 1 is an overall perspective view of a surface-mount LED embodying the present invention, and FIG. 2 is a plan view, as seen from above, of the surface-mount LED shown in FIG. 1. FIG. 3 is a sectional view taken along line 200-200 in FIG. 2. FIGS. 4 to 9 are diagrams illustrating the structure of the surface-mount LED shown in FIG. 1.

As shown in FIGS. 1 and 2, the surface-mount LED 100 according to the embodiment is provided with a substrate 1, light-emitting diode chips (hereinafter "LED chips") 20 mounted on the substrate 1, a reflective frame 30 fixed on the substrate 1 so as to surround the LED chips 20, and a light-transmitting member 40 sealing the inside of the reflective frame 30. The LED chips 20 are one example of what is called a "light-emitting chip" in the present invention.

Figure 5:
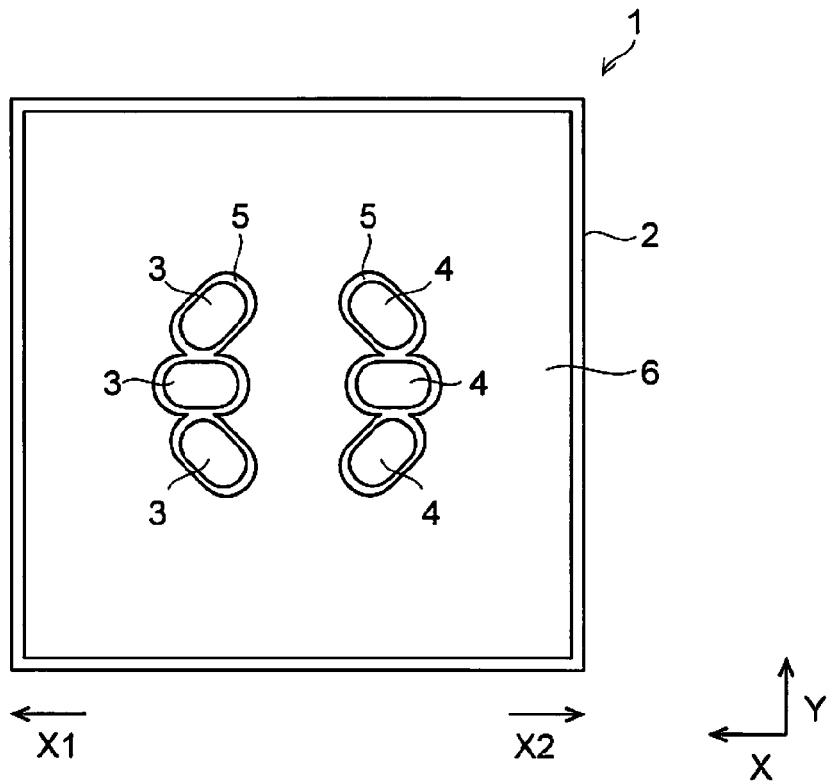
FIG. 5 is a plan view of the substrate of the surface-mount LED of FIG. 1 as seen from above.
Figure 6:
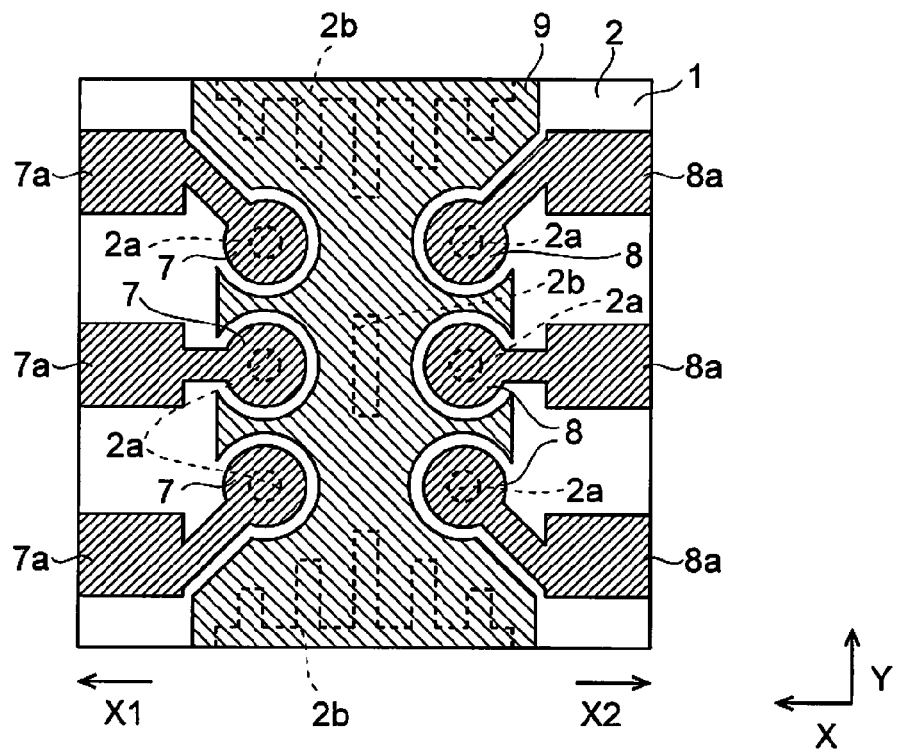
FIG. 6 is a plan view of the surface-mount LED of FIG. 1 as seen from below.

As shown in FIG. 3, the substrate 1 is a two-sided substrate composed of an insulating base 2 that is formed of glass epoxy, liquid crystal polymer (LCP), or the like and that has, formed on each of its top and bottom faces, a plurality of electrode layers 3, 4, and 6 to 9. As shown in FIGS. 5 and 6, the substrate 1 has the shape of a flat hexahedron, about 3.5 mm long in the X direction, about 3.5 mm long in the Y direction perpendicular to the X direction, and about 0.2 mm thick.

As shown in FIGS. 2 and 5, the plurality of electrode layers formed on the top face of the insulating base 2 include a plurality of (three) cathode electrode layers 3 with positive polarity, a plurality of (three) anode electrode layers 4 with negative polarity, and a non-polar electrode layer 6 with no polarity which is electrically separated from the cathode and anode electrode layers 3 and 4 by insulating grooves 5. As shown in FIGS. 1 to 3, the cathode and anode electrode layers 3 and 4 are formed individually on the top face of the insulating base 2 so as to be located in the region inside an opening 31 in the reflective frame 30. The non-polar electrode layer 6 is formed on the top face of the insulating base 2 other than where the cathode and anode electrode layers 3 and 4 are formed. More specifically, as shown in FIG. 5, the region in which the non-polar electrode layer 6 is formed excludes the cathode and anode electrode layers 3 and 4, the insulating grooves 5, and a peripheral portion of the top face of the substrate 1. The non-polar electrode layer 6 is one example of what is called a "conductor layer" in the present invention.

On the other hand, the electrode layers formed on the bottom face of the insulating base 2 includes electrode layers used mainly for wiring and an electrode layer used mainly for heat dissipation; more specifically, as shown in FIG. 6, they include, as electrode layers for wiring, electrode layers 7 and 8 and, as an electrode layer for heat dissipation, an electrode layer 9. The electrode layers 7 are formed in plurality to correspond one to each of the plurality of cathode electrode layers 3 mentioned above, and likewise the electrode layers 8 are formed in plurality to correspond one to each of the plurality of anode electrode layers 4 mentioned above. As shown in FIGS. 3 and 6, the electrode layers 7 and 8 are electrically connected to the corresponding cathode and anode electrode layers 3 and 4 respectively via through holes $2a$ in the insulating base 2. To the electrode layers 7 and 8 for wiring, electrode terminals $7a$ and $8a$, respectively, are integrally connected, with the electrode terminals $7a$ formed at one end (in the X1directing) of the substrate 1 and the electrode terminals $8a$ formed at the other end (in the X1 directing) of the substrate 1.

The electrode layer 9 for heat dissipation makes direct contact with the non-polar electrode layer 6 via a plurality of through holes $2b$ in the insulating base 2. That is, the electrode layer 9 is thermally connected to the non-polar electrode layer 6 via the plurality of through holes $2b$ in the insulating base 2. The cathode and anode electrode layers 3 and 4, the non-polar electrode layer 6, the electrode layers 7 to 9, and the electrode terminals $7a$ and $8a$ are formed of an electrically conductive material with high thermal conductivity, such as copper.

As shown in FIGS. 1 and 2, on the top face of the non-polar electrode layer 6, in the region located inside the opening 31 of the reflective frame 30, three LED chips 20 are fixed, with adhesive 21 (see FIG. 3) or the like. The LED chips 20 are arranged, one at a predetermined distance from another, between the cathode electrode layers 3 and the anode electrode layers 4. The three LED chips 20 have the function of emitting red, green, and blue light respectively.

As shown in FIGS. 1 to 3, the top face of each cathode electrode layer 3 is electrically connected to an electrode portion of the corresponding LED chip 20 via a bonding wire 22, and the top face of each anode electrode layer 4 is electrically connected to another electrode portion of the corresponding LED chip 20 via a bonding wire 23. Thus, when a voltage is applied between the electrode terminals $7a$ of the electrode layers 7 and the electrode terminals $8a$ of the electrode layers 8, an electric current flows via the bonding wires 22 and 23 through the LED chips 20, causing the LED chips 20 to emit light at their respective intrinsic wavelengths. When the LED chips 20 emit light simultaneously, their colors are perceived in a mixed state; thus the surface-mount LED 100 emits white light. The bonding wires 22 and 23 are fine metal wires of gold (Au), silver (Ag), aluminum (Al), or the like. As an alternative structure, an LED chip 20 that emits blue light alone may be mounted, with a phosphor dispersed in the light-transmitting member 40 such that the surface-mount LED 100 emits white light.

Figure 8:
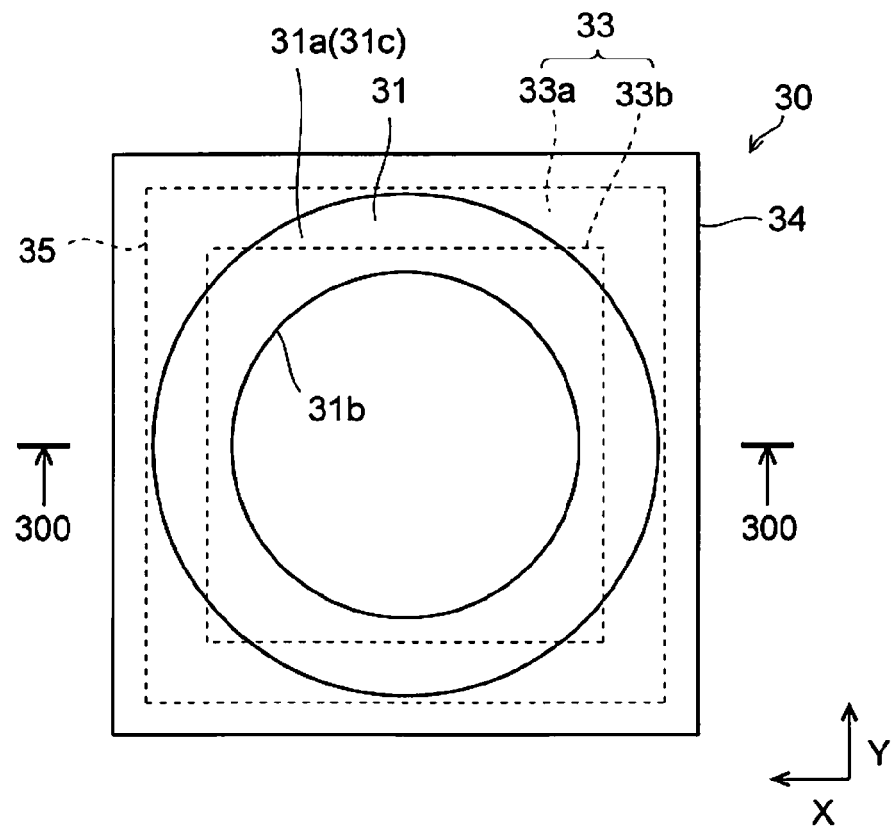
FIG. 8 is a plan view of the reflective frame of the surface-mount LED of FIG. 1.

As shown in FIGS. 1 and 2, the reflective frame 30 is formed approximately as large as the substrate 1 as seen in a plan view. Specifically, as shown in FIG. 8, the reflective frame 30 is substantially square in shape, about 3.5 mm long in the X direction and about 3.5 mm long also in the Y direction. In the present embodiment, the reflective frame 30 is about 0.6 mm thick.

Figure 9:
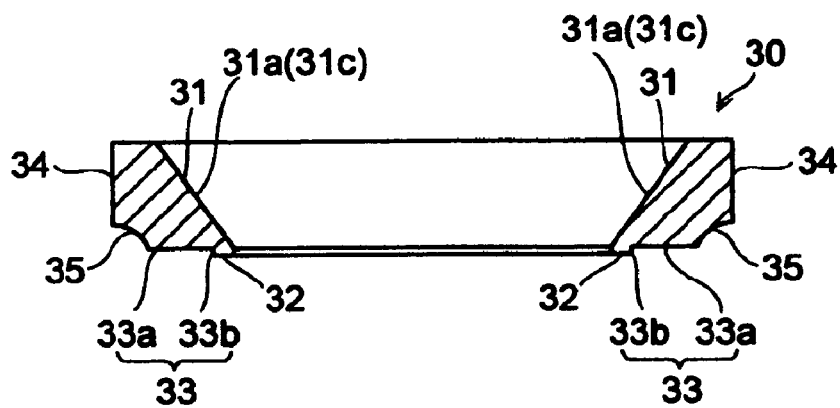
FIG. 9 is a sectional view taken along line 300-300 in FIG. 3.

As shown in FIGS. 1 to 3 and 7 to 9, in a central portion of the reflective frame 30, an opening 31 is formed that penetrates it from the top to the bottom face. The opening 31 has its inner side face $31a$ formed to function as a reflective surface for reflecting the light emitted from the LED chips 20. Moreover, as shown in FIGS. 2 and 8, to evenly collect the light emitted from the LED chips 20, the inner side face $31a$ is formed circular in shape as seen from above. Furthermore, as shown in FIGS. 1, 3, and 9, the opening 31 is formed such that its cross sectional area increases upward, with a reverse taper. Thus, the reflective frame has the shape of a flat hexahedron from which a truncated cone has been removed. The inner side face $31a$ is one example of what is called a "reflective surface" in the present invention.

Figure 4:
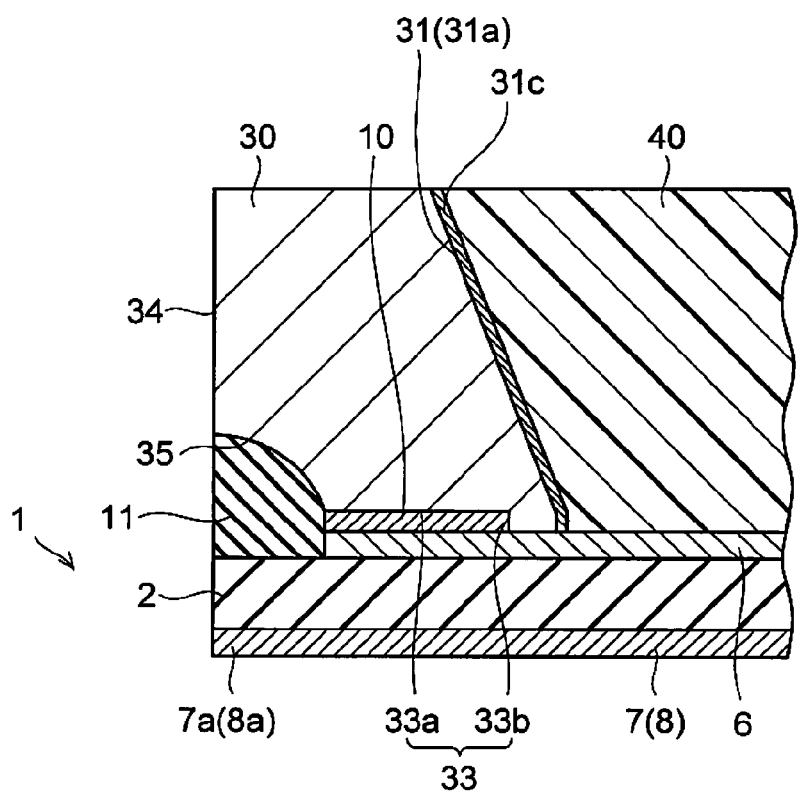
FIG. 4 is an enlarged sectional view showing part of the surface-mount LED of FIG. 1.

The reflective frame 30 is formed of a metal material containing as its main content aluminum, which has an excellent heat dissipation property. Moreover, as shown in FIGS. 3 and 4, on the surface of the inner side face $31a$ of the opening 31, an anodized aluminum coat $31a$ is formed by anodization. Aluminum, which is the main content of the metal material of which the reflective frame 30 is formed, has high light reflectivity and excellent light emission characteristics on one hand but is extremely easily oxidized on the other hand; thus aluminum is easily oxidized by oxygen in air, forming an oxide film on the surface. For example, if the surface of the inner side face $31a$ of the opening 31 is not treated by anodization, during the process of manufacturing or the like, at the surface of the inner side face $31a$ of the reflective frame 30, aluminum is easily oxidized by oxygen in air. Since this oxidation of aluminum occurs naturally, the thickness, shape, etc. of the oxide film formed are not uniform but nonuniform. This lessens the adhesion between the light-transmitting member 40, which seals the inside of the reflective frame 30, and the reflective frame 30, producing a gap between the light-transmitting member 40 and the reflective frame 30. If the inner side face $31a$ of the reflective frame 30 is nonuniform and a gap is produced between the light-transmitting member 40 and the reflective frame 30 in this way, variation occurs in the reflection efficiency of the light emitted from the LED chips 20, resulting in low reliability.

In the present embodiment, on the surface of the inner side face $31a$ of the opening 31, an anodized aluminum coat $31c$ is formed by anodization. Anodization is a type of surface treatment called anodic oxidation. In anodization, a member (here, the reflective frame 30) formed of aluminum as an anode and lead or the like as a cathode are immersed in an electrolytic solution, and direct-current electrolysis is performed. By anodization, on the surface of the member (reflective frame 30) formed of aluminum, an oxide coat (anodized coat) of anodized aluminum ($Al_2O_3$) is formed. In the present embodiment, by anodization, a uniform coat of anodized aluminum ($Al_2O_3$) is formed at least on the surface of the inner side face $31a$ of the opening 31 of the reflective frame 30. This improves the adhesion between the reflective frame 30 and the light-transmitting member 40, and reduces variation in the reflection efficiency of the light emitted from the LED chips 20. It is thus possible to enhance the reliability of the surface-mount LED 100.

Next, the thickness of the anodized aluminum coat $31c$ formed on the surface of the inner side face $31a$ of the opening 31 will be described. To study a preferable range of the thickness of the anodized aluminum coat $31c$ formed on the surface of the inner side face 31a of the opening 31, experiments were conducted in the following manner with anodized coats of varying thicknesses.

Anodization: The surface of the reflective frame was degreased by cleaning with trichloroethylene or the like, and was then flushed with water. Next, with the reflective frame as an anode and lead as a cathode, electrolysis was performed in an electrolytic solution containing sulfuring acid and water to form an anodized aluminum coat on the surface of the reflective frame. Subsequently, the reflective frame was hydrated in high-temperature high-pressure steam or in hot water for the pore-sealing of the anodized aluminum coat. In the experiments, the anodized aluminum coat was formed such that different samples of the anodized aluminum coat formed had thicknesses of 1 μm, 2 μm, 3 μm, 5 μm, 10 μm, and 20 μm respectively as shown in FIGS. 10 and 11.

Luminous intensity of emitted light and variation in chromaticity coordinate: Each of the reflective frames having anodized aluminum coats of different thicknesses formed on them was mounted on a surface-mount LED, and then, with a voltage applied such that the current through each LED chip was 40 mA and that the total current was 120 mA, the luminous intensity of the emitted light was measured. From the measurements obtained, the average luminous intensity of the emitted light was found for each anodized aluminum coat thickness. Moreover, the variation in the chromaticity coordinate (x) was found for each anodized aluminum coat thickness. The results are shown in FIGS. 10 and 11. FIG. 10 is a diagram showing the relationship between the thickness of the anodized aluminum coat and the luminous intensity of the emitted light, and FIG. 11 is a diagram showing the relationship between the thickness of the anodized aluminum coat and the variation in the chromaticity coordinate (x). In the present embodiment, as the indicator of the variation, the value of 6σ (where σ denotes the standard deviation) is used.

Figure 10:
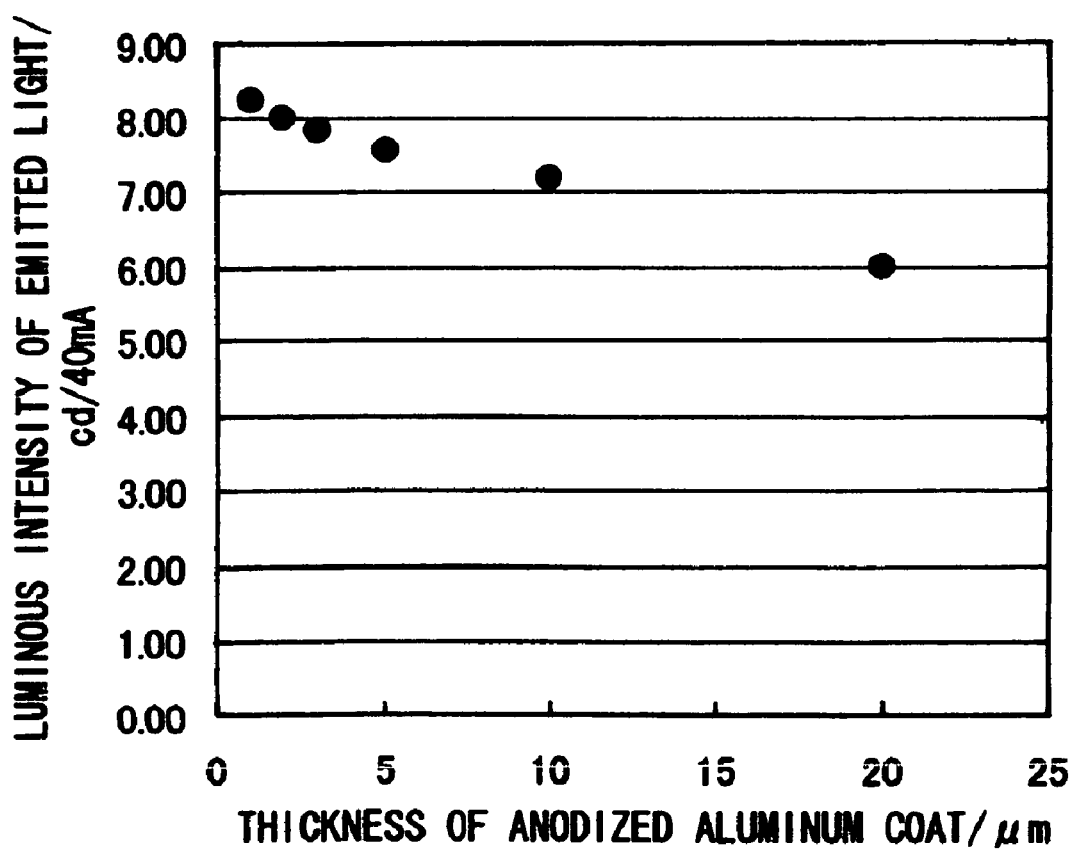
FIG. 10 is a diagram showing the relationship between the thickness of the anodized aluminum coat and the luminous intensity of the emitted light.

As shown in FIG. 10, a tendency is observed that as the thickness of the anodized aluminum coat increases, the luminous intensity of the emitted light decreases. That is, a larger thickness of the anodized aluminum coat leads to a lower luminous intensity of the emitted light; thus, to obtain a desired luminous intensity, for example to obtain a luminous intensity approximately equal to that obtained when the anodized aluminum coat has a thickness of 1 μm, it is necessary, for example, to increase the voltage applied. In this way, as the thickness of the anodized aluminum coat increases, the decreasing luminous intensity of the emitted light poses problems in terms of energy-saving and practicality. From the viewpoint of energy-saving and practicality, a drop of, for example, about 10% from the luminous intensity obtained when, for example, the anodized aluminum coat has a thickness of 1 μm practically does not affect normal use. The just discussed results thus show that, in an embodiment of the present invention, it is preferable that the anodized aluminum coat have a thickness of 10 μm or less.

Figure 11:
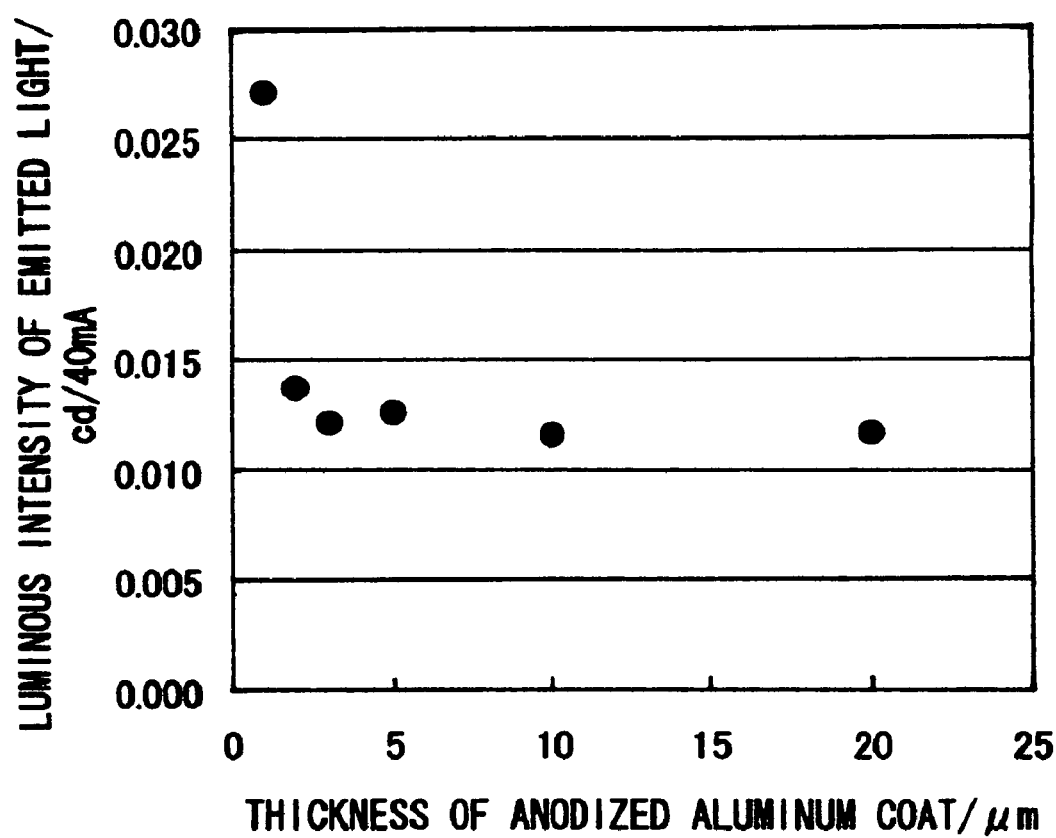
FIG. 11 is a diagram showing the relationship between the thickness of the anodized aluminum coat and the variation in the chromaticity coordinate (x).

On the other hand, as shown in FIG. 11, a study of the thickness of the anodized aluminum coat and the variation in the chromaticity coordinate (x) revealed that the variation in the chromaticity coordinate (x) was extremely large when the anodized aluminum coat had a thickness of 1 μm as compared with when it had any other thickness. A probable explanation is that the small thickness of the anodized aluminum coat made it difficult to form a uniform coat by anodization and led to a large variation in chromaticity. That is, it is believed that, with a small thickness, the anodized aluminum coat, when formed by anodization, is formed with a nonuniform thickness, and that this causes variation in the reflection efficiency of the reflective frame itself, lessens the adhesion between the reflective frame and the light-transmitting member, and causes variation in the reflection efficiency of the light emitted from the LED chips, lowering the reliability of the surface-mount LED. The just discussed results thus show that it is preferable that the anodized aluminum coat have a thickness of more than 1 μm.

Thus, through the experiments described above, it was found out that, in an embodiment of the present invention, it is preferable that the anodized aluminum coat 31c have a thickness of 2 μm to 10 μm, more preferably 2 μm to 5 μm.

As shown in FIGS. 1, 2, and 4, the inside of the reflective frame 30 is sealed by the light-transmitting member 40. The light-transmitting member 40 is formed of a resin material such as epoxy resin or silicone resin, and is so arranged that the LED chips 20 and the bonding wires 22 and 23 are sealed inside the opening 31 of the reflective frame 30. As a result of the light-transmitting member 40 sealing the LED chips 20 and the bonding wires 22 and 23 in this way, the LED chips 20 and the bonding wires 22 and 23 are prevented from making contact with air and moisture in air.

Figure 7:
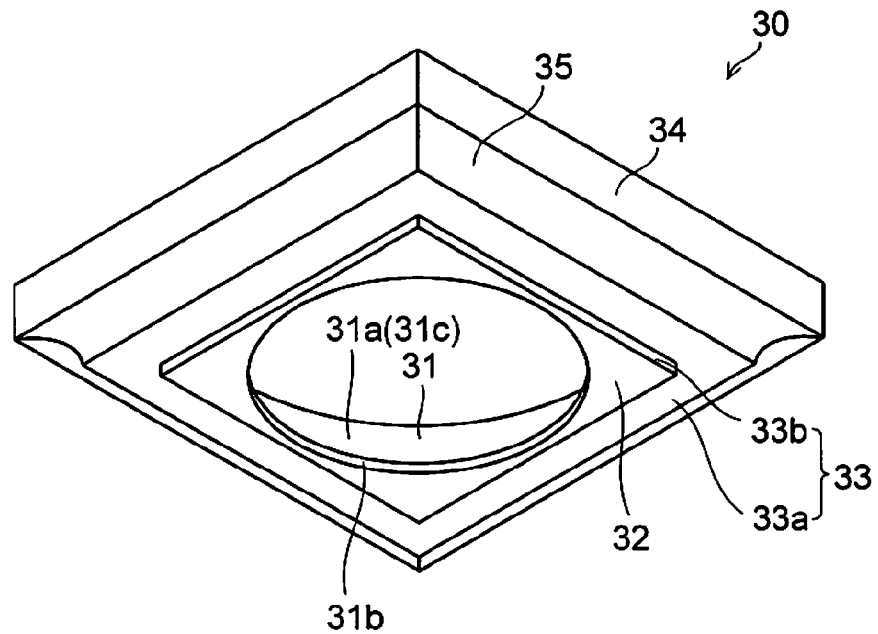
FIG. 7 is a perspective view of the reflective frame of the surface-mount LED of FIG. 1.

In the present embodiment, as shown in FIGS. 7 and 9, on the bottom face 32 of the reflective frame 30, a step portion 33 is formed. The step portion 33 is composed of a bottom face portion 33a and a side face portion 33b, and is formed, in a region on the bottom face 32 a predetermined distance away from the bottom-side opening end 31b of the opening 31 (i.e. in a predetermined peripheral region on the bottom face 32), so as to surround the bottom-side opening end 31b. That is, the step portion 33 is formed so that the side face portion 33b surrounds the bottom-side opening end 31b. The step portion 33 is formed integrally with the reflective frame 30 by press molding or the like. Moreover, as shown in FIGS. 4 and 7, along all the four edges formed by the bottom face portion 33a of the step portion 33 and the outer wall side face 34 of the reflective frame 30, cut-away portions 35 are formed with an arc-shaped cross section.

As shown in FIGS. 3 and 4, the reflective frame 30 is bonded to the non-polar electrode layer 6 with adhesive 10. In the present embodiment, as the adhesive 10, an electrically conductive adhesive is used that is formed of thermosetting silver paste (with an Ag content (after setting) of 94% and a thermal conductivity of 85 W/m·K). Specifically, by screen printing, the adhesive 10 is applied to a predetermined region on the non-polar electrode layer 6, i.e. the region on it corresponding to the bottom face portion 33a of the step portion 33; then the reflective frame 30 is placed on the non-polar electrode layer 6 on the substrate 1. Then, by heating at a predetermined temperature, the adhesive is set, so that the reflective frame 30 is bonded to the non-polar electrode layer 6. In this way, the reflective frame 30 is fixed on the substrate 1 such that the inner side face 31a of the opening 31 surrounds the LED chips 20. In a case where an electrically conductive adhesive is used as the adhesive 10 as described above, the optimal condition for setting is, at 175° C., about 60 minutes and, at 200° C., about 30 minutes. Using as the adhesive 10 an electrically conductive adhesive formed of silver paste in this way allows treatment at a low temperature of 175° C. to 200° C., and thus helps simplify the bonding process of the reflective frame 30.

In the present embodiment, the side face portion 33b of the step portion 33 formed on the bottom face 32 of the reflective frame 30 prevents the adhesive 10 from flowing into the region inside the reflective frame 30. It is thus possible to suppress the irradiation of the adhesive 10 with the light emitted from the LED chips 20. This helps suppress the discoloration, resulting from deterioration or alternation, of the adhesive 10. It is thus possible to suppress the inconvenience of the light from the LED chips 20 being absorbed by the adhesive 10.

In the present embodiment, as shown in FIGS. 3 and 4, the cut-away portions 35 formed in the bottom portion of the reflective frame 30 are sealed by an insulating member 11 so as to surround the adhesive 10. This suppresses the contact of the adhesive 10 with air or moisture in air, and thus helps suppress the discoloration, resulting from deterioration or alternation, of the adhesive 10.

As shown in FIGS. 1 to 3 and 6, the heat generated by the light emission of the LED chips 20 is dissipated by the non-polar electrode layer 6 formed on the top face of the insulating base 2, and also by the electrode layer 9 for heat dissipation, which is thermally connected via the through holes 2b in the insulating base 2 to the non-polar electrode layer 6. Moreover, as shown in FIGS. 4 and 9, also from the reflective frame 30, which is bonded to the non-polar electrode layer 6 with the adhesive 10, via the adhesive 10 and via the bottom face 32 of the reflective frame 30, the heat generated by the light emission of the LED chips 20 is conducted and dissipated. In a case where the electrode layer 9 for heat dissipation makes thermal contact with a heat sink or the like of a circuit board (unillustrated), this further promotes heat dissipation. In this way, in the surface-mount LED 100 of the present embodiment, the heat generated by the LED chips 20 can be dissipated efficiently. This suppresses the degradation of light emission efficiency (light emission characteristics) ascribable to a rise in the temperature of the LED chips 20, and also helps obtain high brightness proportional to the current fed, enhancing the functionality of and prolonging the lifetime of the surface-mount LED 100.

In the present embodiment, the non-polar electrode layer 6 is electrically separated from at least either the cathode electrode layers 3 or the anode electrode layers 4. This makes it possible to fix the reflective frame 30 on the substrate 1 without giving consideration to electrical short-circuiting.

It should be understood that the embodiment described above is merely an example in every respect and is not meant to limit the present invention in any way. The scope of the present invention is defined by the appended claims rather than by the embodiment described above, and encompasses all variations and modifications made within the sense and scope equivalent to what is recited in the appended claims.

For example, although the above described embodiment deals with an example in which the present invention is applied to a surface-mount LED, this is not meant to limit the present invention: the present invention may be applied to any light-emitting device other than a surface-mount LED.

For another example, although the above described embodiment deals with an example in which an LED chip as an example of a light-emitting chip is provided in a light-emitting device, this is not meant to limit the present invention: any light-emitting chip other than an LED chip may be provided in a light-emitting device.

For another example, although the above described embodiment deals with an example in which an anodized aluminum coat is formed on the surface of the inner side face of an opening in a reflective frame, this is not meant to limit the present invention: an anodized aluminum coat may instead be formed on the part of the reflective frame other than where it makes contact with a non-polar electrode layer. Incidentally, as a method for removing the anodized aluminum coat from the part of the reflective frame where it makes contact with a conductor layer, i.e. where the formation of a coat by anodization is not desirable, it is possible to adopt a mechanical method, such as blasting or buff-polishing, or a chemical method. On the part of the reflective frame where it makes contact with a non-polar electrode layer, a plated metal layer may be formed by the plating of a metal. In that case, examples of the metal material so plated include silver.

For another example, although the above described embodiment deals with an example in which an electrically conductive adhesive formed of silver paste is used as an adhesive, this is not meant to limit the present invention: an adhesive based on resin such as epoxy resin or acrylic resin may instead be used. It is also possible to use an electrically conductive adhesive other than one formed of silver paste, or to use a high-thermal-conductivity resin adhesive. Examples of electrically conductive adhesives other than those formed of silver paste include those formed of silver solder or gold-tin solder.

For another example, although the above described embodiment deals with an example in which cut-away portions are formed in a reflective frame and those cut-away portions are sealed by an insulating member, this is not meant to limit the present invention: cut-away portions need not be sealed by an insulating member. It is also possible not to form cut-away portions in the first place.

For another example, although the above described embodiment deals with an example in which three—red, green, and blue—LED chips are mounted, this is not meant to limit the present invention: one, or two, or four or more LEDs may instead be mounted.

For another example, although the above described embodiment deals with an example in which an LED chip is mounted on an electrode layer with no electrical polarity (non-polar electrode layer), this is not meant to limit the present invention: an LED may instead be mounted on an electrode layer that is connected to ground.

For another example, although the above described embodiment deals with an example in which a reflective frame is formed only in a single tier, this is not meant to limit the present invention: on a first reflective frame, a second reflective frame may be additionally formed that is bonded to the top face of the first. In that case, on the surface of the inner side face of the second reflective frame, an anodized aluminum coat may, or may not, be formed by anodizing; the inside of the second reflective frame may, or may not, be sealed by a light-transmitting member.

What is claimed is:

1. A light-emitting device comprising:
   a substrate on a principal surface of which a conductor layer is formed;
   a light-emitting chip mounted in a predetermined region on the conductor layer;
   a plurality of electrode layers formed on the principal surface of the substrate for supplying electric power to the light-emitting chip; and
   a reflective frame formed of a metal material containing aluminum as a main content thereof, the reflective frame having an inner circumferential surface thereof formed into a reflective surface for reflecting light from the light-emitting chip, wherein
   the plurality of electrode layers include a cathode electrode layer and an anode electrode layer,
   the conductor layer is electrically separated from at least one of the cathode electrode layer and the anode electrode layer,
   the reflective frame is fixed, directly, or indirectly with adhesive, to the conductor layer so as to surround the light-emitting chip, with an inside of the reflective frame sealed with a light-transmitting member, and an anodized aluminum coat with a thickness of 2 μm to 10 μm is formed by anodization at least on the reflective surface of the reflective frame.

2. The light-emitting device according to claim 1, wherein the thickness of the anodized aluminum coat formed by anodization is 2 μm to 5 μm.

3. The light-emitting device according to claim 1, wherein the anodized aluminum coat is formed by anodization on part of the reflective frame other than where the reflective frame makes contact with the conductor layer.

4. The light-emitting device according to claim 1, wherein a plated metal layer is formed by plating of a metal on part of the reflective frame where the reflective frame makes contact with the conductor layer.

5. The light-emitting device according to claim 1, wherein the adhesive is an electrically conductive adhesive.

6. The light-emitting device according to claim 1, wherein a step portion is formed in a bottom portion of the reflective frame, and the step portion has a side wall portion for preventing the adhesive fixing the reflective frame to the conductor layer from flowing into a region inside the reflective frame.

7. The light-emitting device according to claim 1, wherein the light-emitting chip is a light-emitting diode chip.

* * * * *